United States Patent
Chan et al.

(10) Patent No.: US 8,035,141 B2
(45) Date of Patent: Oct. 11, 2011

(54) BI-LAYER NFET EMBEDDED STRESSOR ELEMENT AND INTEGRATION TO ENHANCE DRIVE CURRENT

(75) Inventors: Kevin K. Chan, Yorktown Heights, NY (US); Abhishek Dube, Hopewell Junction, NY (US); Jinghong Li, Hopewell Junction, NY (US); Viorel Ontalus, Hopewell Junction, NY (US); Zhengmao Zhu, Hopewell Junction, NY (US)

(73) Assignee: International Business Machines Corporation, Armonk, NY (US)

( * ) Notice: Subject to any disclaimer, the term of this patent is extended or adjusted under 35 U.S.C. 154(b) by 7 days.

(21) Appl. No.: 12/607,104

(22) Filed: Oct. 28, 2009

(65) Prior Publication Data

US 2011/0095343 A1 Apr. 28, 2011

(51) Int. Cl.
*H01L 29/76* (2006.01)

(52) U.S. Cl. ........ 257/288; 257/213; 257/230; 257/900; 257/902; 257/903; 257/E21.19; 257/E21.21; 257/E21.394; 257/E21.458; 257/E21.615; 257/E21.694; 257/E21.435; 257/E21.619; 257/E29.346; 257/E29.325; 257/413; 257/255; 257/408; 257/303

(58) Field of Classification Search .................. 257/288, 257/255, 408, E29.004, E29.266, E21.409, 257/413, 900, 903, E21.19, E21.21, E21.458, 257/E21.615, E21.431, E21.435, E21.619, 257/E29.325; 438/198, 303
See application file for complete search history.

(56) References Cited

U.S. PATENT DOCUMENTS

| | | | |
|---|---|---|---|
| 7,413,961 B2 | 8/2008 | Chong et al. | |
| 7,446,026 B2 | 11/2008 | Zhang et al. | |
| 7,494,884 B2 | 2/2009 | Lin et al. | |
| 2006/0046366 A1* | 3/2006 | Orlowski et al. | 438/198 |
| 2006/0138398 A1* | 6/2006 | Shimamune et al. | 257/19 |
| 2006/0234455 A1 | 10/2006 | Chen et al. | |
| 2007/0057287 A1 | 3/2007 | Lin et al. | |
| 2007/0093033 A1* | 4/2007 | Wang et al. | 438/303 |

(Continued)

OTHER PUBLICATIONS

Ang, K. W., et al., "Enhanced performance in 50 nm N-MOSFETs with silicon-carbon source/drain regions", IEEE International Electron Devices Meeting 2004, pp. 1069-1071, Piscataway NJ.

(Continued)

*Primary Examiner* — Wael Fahmy
*Assistant Examiner* — Marc Armand
(74) *Attorney, Agent, or Firm* — Scully, Scott, Murphy & Presser, P.C.; H. Daniel Schnurmann

(57) ABSTRACT

A semiconductor structure including a bi-layer nFET embedded stressor element is disclosed. The bi-layer nFET embedded stressor element can be integrated into any CMOS process flow. The bi-layer nFET embedded stressor element includes an implant damaged free first layer of a first epitaxy semiconductor material having a lattice constant that is different from a lattice constant of a semiconductor substrate and imparts a tensile strain in a device channel of an nFET gate stack. Typically, and when the semiconductor is composed of silicon, the first layer of the bi-layer nFET embedded stressor element is composed of Si:C. The bi-layer nFET embedded stressor element further includes a second layer of a second epitaxy semiconductor material that has a lower resistance to dopant diffusion than the first epitaxy semiconductor material. Typically, and when the semiconductor is composed of silicon, the second layer of the bi-layer nFET embedded stressor element is composed of silicon. Only the second layer of the bi-layer nFET embedded stressor element includes the implanted source/drain regions.

24 Claims, 3 Drawing Sheets

U.S. PATENT DOCUMENTS

| | | | |
|---|---|---|---|
| 2007/0126036 A1 | 6/2007 | Ohta et al. | |
| 2007/0132038 A1 | 6/2007 | Chong et al. | |
| 2007/0138570 A1 | 6/2007 | Chong et al. | |
| 2007/0173022 A1 | 7/2007 | Wang et al. | |
| 2007/0184601 A1 | 8/2007 | Zhang et al. | |
| 2008/0001182 A1 | 1/2008 | Chen et al. | |
| 2008/0006818 A1 | 1/2008 | Luo et al. | |
| 2008/0067557 A1* | 3/2008 | Yu et al. | 257/255 |
| 2008/0083948 A1 | 4/2008 | Lin et al. | |
| 2008/0157200 A1 | 7/2008 | Kim et al. | |
| 2008/0299724 A1 | 12/2008 | Grudowski et al. | |
| 2009/0140351 A1 | 6/2009 | Lin | |
| 2009/0152626 A1* | 6/2009 | Venugopal et al. | 257/338 |
| 2009/0221119 A1 | 9/2009 | Grudowski et al. | |
| 2009/0242989 A1 | 10/2009 | Chan et al. | |

OTHER PUBLICATIONS

Chung, S. S., et al., "Design of high-performance and highly reliable nMOSFETs with embedded Si:C S/D extension stressor(Si:C S/D-E)", Symposium on VLSI Technology Digest of Technical Papers, 2009, pp. 158-159.

Liu, Y., et al., "Strained Si Channel MOSFETs with Embedded Silicon Carbon Formed by Solid Phase Epitaxy" VLSI Technology, 2007 IEEE Symposium, Jun. 12-14, 2007, pp. 44-45.

Ren, Z., et al., "On implementation of embedded phosphorus-doped SiC stressors in SOI nMOSFETs", VLSI Technology, 2008 Symposium, Jun. 17-19, 2008, pp. 172-173.

Wong, H.-S., et al., "Silicon-Carbon Stressors With High Substitutional Carbon Concentration and In Situ Doping Formed in Source/Drain Extensions of n-Channel Transistors", IEEE Electron Device Letters, 2008, pp. 460-463, vol. 29, No. 5.

Yang, B., et al., "High-performance nMOSFET with in-situ phosphorus-doped embedded Si:C (ISPD eSi:C) source-drain stressor", Electron Devices Meeting, 2008, IEDM 2008, IEEE International, Dec. 15-17, 2008, pp. 1-4.

International Search Report—Jan. 25, 2011 (PCT/EP2010/065495).

* cited by examiner

BI-LAYER NFET EMBEDDED STRESSOR ELEMENT AND INTEGRATION TO ENHANCE DRIVE CURRENT

BACKGROUND

The present invention relates to a semiconductor structure and a method of fabricating the same. More particularly, the present invention relates to a bi-layer embedded stressor element for n-channel field effect transistors (nFETs) which greatly minimizes defect density and is implant damage free as well as a method of fabricating the bi-layer nFET embedded stressor element.

Mechanical stresses within a semiconductor device substrate have been widely used to modulate device performance such as, for example drive current. For example, in common silicon technology, the channel of a transistor is oriented along the {110} planes of silicon. In this arrangement, hole mobility is enhanced when the channel is under compressive stress in the film direction and/or under tensile stress in a direction normal of the channel, while the electron mobility is enhanced when the silicon film is under tensile stress in the film direction and/or under compressive stress in the direction normal of the channel. Therefore, compressive and/or tensile stresses can be advantageously created in the channel region of a p-channel field effect transistor (pFET) and/or an n-channel field effect transistor (nFET) in order to enhance the performance of such devices.

One possible approach for creating a desirable stressed silicon channel region is to form embedded SiGe or Si:C stressors (i.e., stress wells) within the source and drain regions of a complementary metal oxide semiconductor (CMOS) device to induce compressive or tensile strain in the channel region located between the source region and the drain region. For example, it has been demonstrated that hole mobility can be enhanced significantly in p-channel silicon transistors by using an embedded SiGe stressor in the source and drain regions. For re-channel silicon transistors, it has also been demonstrated that the electron mobility can be enhanced by using selective Si:C in which C is substitutional.

When the Si:C stressor includes a high content of C in substitutional sites of Si, a higher tensile strain can be applied to the Si channel. However, it is extremely difficult to obtain selectivity to oxide and nitride with a high content of C in the substitutional sites of Si due to extremely low carbon solubility (on the order of less than $10^{-6}$) in Si and the incompatibility of the Si:C precursor reactant gas to obtain selectivity.

Moreover, the integration of embedded Si:C into a typical complementary metal oxide semiconductor (CMOS) process is difficult because either the implantation process or the anneal process can completely relax the embedded Si:C. In prior art processes including an embedded Si:C stressor, high defect density is generated and dopant diffusion is uncontrollable in the embedded Si:C stressor.

BRIEF SUMMARY

A semiconductor structure including a bi-layer nFET embedded stressor element is disclosed. The bi-layer nFET embedded stressor element employed in the instant application overcomes the problems associated with prior art Si:C embedded stressor elements. Moreover, the bi-layer nFET embedded stressor element can be integrated into any CMOS process flow. Furthermore, the bi-layer nFET embedded stressor element includes an implant damaged free first layer of a first epitaxy semiconductor material having a lattice constant that is different from a lattice constant of a semiconductor substrate and imparts a tensile strain in a device channel of an nFET gate stack. Typically, when the semiconductor is composed of silicon, the first layer of the bi-layer nFET embedded stressor element is composed of Si:C. The bi-layer nFET embedded stressor element further includes a second layer of a second epitaxy semiconductor material that has a lower resistance to dopant diffusion than the first epitaxy semiconductor material. The second layer of the bi-layered nFET embedded stressor element is located on an upper surface of the first layer of the bi-layered nFET embedded stressor element. Typically, and when the semiconductor is composed of silicon, the second layer of the bi-layer nFET embedded stressor element is composed of silicon. The second layer of the bi-layer nFET embedded stressor element includes the implanted source/drain regions.

In an aspect of the invention, a semiconductor structure is provided that includes a bi-layer nFET embedded stressor element. The structure includes at least one nFET gate stack located on an upper surface of a semiconductor substrate. A bi-layer nFET embedded stressor element is located at a footprint of the at least one nFET gate stack substantially within a pair of recessed regions which are present on opposite sides of the at least one nFET gate stack. The bi-layer nFET embedded stressor element includes a first layer of a first epitaxy semiconductor material having a lattice constant that is different from a lattice constant of the semiconductor substrate and imparts a tensile strain in a device channel that is located beneath the at least one nFET gate stack, and a second layer of a second epitaxy semiconductor material that has a lower resistance to dopant diffusion than the first epitaxy semiconductor material. The structure further includes a source/drain region located within the second layer of the bi-layer nFET embedded stressor element, but not the first layer of the bi-layer nFET embedded stressor element.

In one preferred embodiment, a semiconductor structure is provided that includes at least one nFET gate stack located on an upper surface of a semiconductor substrate. A bi-layer nFET embedded stressor element is located at a footprint of the at least one nFET gate stack substantially within a pair of recessed regions which are present on opposite sides of the at least one nFET gate stack. The bi-layer nFET embedded stressor element includes a first layer comprised of Si:C and a second layer comprised of silicon, which is preferably doped with phosphorus, that is located atop the first layer of Si:C. The structure further includes a source/drain region within the second layer of the bi-layer nFET embedded stressor element, but not the first layer of the bi-layer nFET embedded stressor element.

In another aspect of the invention, a method of fabricating a semiconductor structure including a bi-layer nFET embedded stressor element is provided. The method includes forming a pair of recessed regions within a semiconductor substrate at a footprint of an nFET gate stack. A bi-layer nFET embedded stressor element is formed within each of the recessed regions. The bi-layer nFET stressor element includes a first layer of a first epitaxy semiconductor material having a lattice constant that is different from a lattice constant of the semiconductor substrate and imparts a tensile strain in a device channel that is located beneath the at least one nFET gate stack, and a second layer of a second epitaxy semiconductor material that has a lower resistance to dopant diffusion than the first epitaxy semiconductor material. A spacer (i.e., outer spacer) is formed adjoining the nFET gate stack. The spacer has a base that covers an upper surface of the first layer of the bi-layer nFET stressor element and extends onto an upper surface of the second layer of the bi-layer nFET stressor element. A source/drain region is formed within the second layer of the bi-layer nFET embedded stressor element using the spacer as an ion implantation mask, but not said first layer of said bi-layer nFET stressor element.

DETAILED DESCRIPTION OF THE INVENTION

In the following description, numerous specific details are set forth, such as particular structures, components, materials, dimensions, processing steps and techniques, in order to provide an understanding of some aspects of the present invention. However, it will be appreciated by one of ordinary skill in the art that the invention may be practiced without these specific details. In other instances, well-known structures or processing steps have not been described in detail in order to avoid obscuring the invention.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "beneath" or "under" another element, it can be directly beneath or under the other element, or intervening elements may be present. In contrast, when an element is referred to as being "directly beneath" or "directly under" another element, there are no intervening elements present.

Embodiments of the present invention will now be described in greater detail by referring to the following discussion and drawings that accompany the present application. The drawings of the present application, which are referred to herein below in greater detail, are provided for illustrative purposes and, as such, they are not drawn to scale.

Figure 1:
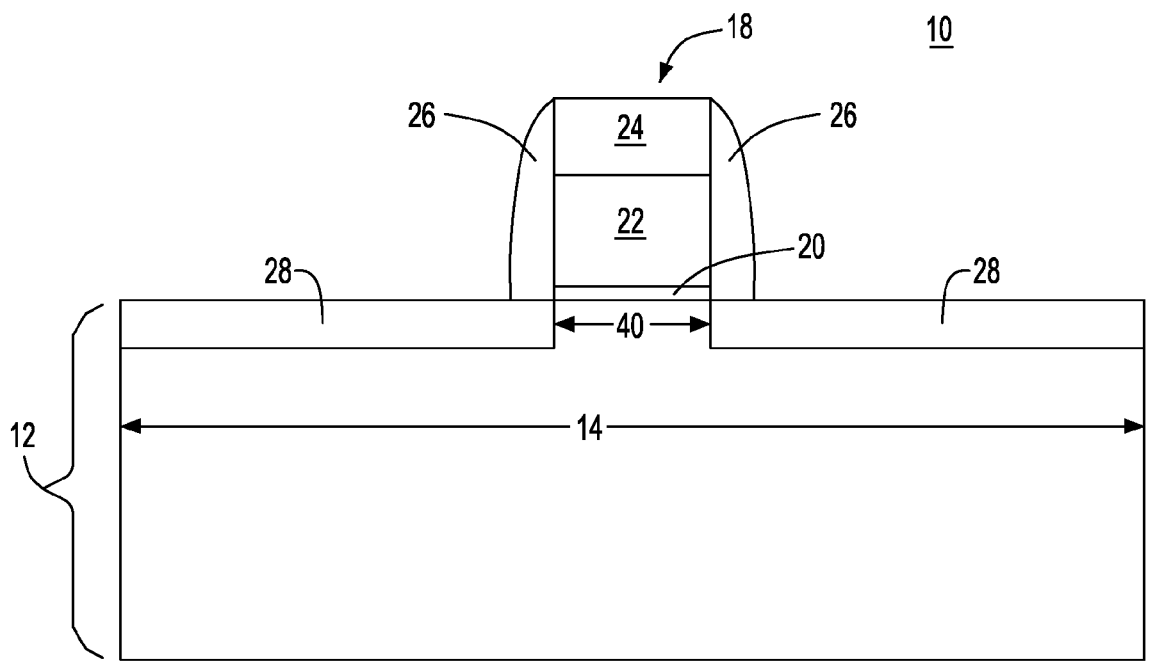
FIG. 1 is a pictorial representation (through a cross sectional view) illustrating an initial structure including a semiconductor structure having a least one nFET gate stack located on an upper surface of a semiconductor substrate that can be employed in one embodiment of the present invention.

Reference is first made to FIG. 1 which illustrates an initial structure 10 that can be employed in one embodiment of the present invention. The initial structure 10 includes a semiconductor substrate 12 having at least one nFET device region 14. The semiconductor substrate 12 can also include at least one isolation region (not specifically shown). The initial structure 10 further includes at least one nFET gate stack 18 located on an upper surface of the at least one nFET device region 14 of the semiconductor substrate 12. The at least one nFET gate stack 18, which is typically patterned, includes, from bottom to top, a gate dielectric 20, a gate electrode 22 and an optional gate electrode cap 24; gate electrode cap 24 can also be referred to herein as a dielectric cap. At least one spacer 26 (which can be referred to as an inner spacer) is typically located on the sidewalls of each of the nFET gate stacks that are present in the initial structure 10. In some embodiments, no spacer 26 is present.

It is noted that the present invention also contemplates the presence of at least one pFET gate stack (not shown) located on a surface of a pFET device region (not shown) of semiconductor substrate 12. The pFET device region and the at least one pFET gate stack would be located to the left and/or right of the nFET device region 14 shown in FIG. 1.

The initial structure 10 shown in FIG. 1 can be formed by conventional methods and include materials well known to those skilled in the art. For example, the semiconductor substrate 12 of the initial structure 10 can be comprised of any semiconductor material including, but not limited to Si, Ge, SiGe, SiC, SiGeC, GaAs, GaN, InAs, InP and all other III/V or II/VI compound semiconductors. The semiconductor material of the semiconductor substrate 12 has a lattice constant that is dependent on the type of semiconductor material employed. Semiconductor substrate 12 may also comprise an organic semiconductor or a layered semiconductor such as Si/SiGe, a silicon-on-insulator (SOI), a SiGe-on-insulator (SGOI) or a germanium-on-insulator (GOI). In one embodiment of the invention, the semiconductor substrate 12 includes an SOI substrate in which top and bottom semiconductor material layers such as Si are spaced apart by a buried dielectric such as a buried oxide. In a preferred embodiment of the present invention, the semiconductor substrate 12 is composed of bulk silicon or a silicon-on-insulator. The semiconductor substrate 12 may be doped, undoped or contain doped and undoped regions therein. The semiconductor substrate 12 may include a single crystal orientation or it may include at least two coplanar surface regions that have different crystal orientations (the latter substrate is referred to in the art as a hybrid substrate). When a hybrid substrate is employed, an nFET is typically formed on a {100} crystal surface, while a pFET is typically formed on a {110} crystal plane. Thus, for example, nFET device region 14 may have a {100} crystal surface, while a pFET device region (not shown) may have a {110} crystal plane. The hybrid substrate can be formed by techniques that are well known in the art. See, for example, co-owned U.S. Pat. No. 7,329,923, U.S. Publication No. 2005/0116290, dated Jun. 2, 2005 and U.S. Pat. No. 7,023,055, the entire contents of each are incorporated herein by reference.

The at least one isolation region (not specifically shown) is typically formed into the semiconductor substrate 12 so as to form device regions within the semiconductor substrate 12. The at least one isolation region may be a trench isolation region or a field oxide isolation region. The trench isolation region is formed utilizing a conventional trench isolation process well known to those skilled in the art. For example, lithography, etching and filling of the trench with a trench dielectric may be used in forming the trench isolation region. Optionally, a liner may be formed in the trench prior to trench fill, a densification step may be performed after the trench fill and a planarization process may follow the trench fill as well. The height of the trench isolation region can be adjusted by performing a wet etching process such as etching with a solution containing hydrofluoric acid. The field oxide can be formed utilizing a so-called local oxidation of silicon process.

The various device regions, such as nFET device region 14, may be doped (e.g., by ion implantation processes) to form well regions within the different device regions. For clarity, the well regions are not specifically shown in the drawings of the present application. The well regions for pFET devices typically include an n-type dopant, and the well regions for nFET devices typically include a p-type dopant. The dopant concentration of the well regions of the same conductivity type device may be the same or different. Likewise, the dopant concentration of the well regions of the different conductivity type may be the same or different.

After processing the semiconductor substrate 12, the at least one nFET gate stack 18 is formed utilizing any conventional process that is well known to those skilled in the art; at least one pFET gate stack can also be formed within a pFET device region before, during or after forming the at least one nFET gate stack 18. In one embodiment, the at least one nFET gate stack 18 is formed by deposition of various material layers, followed by patterning the deposited material layers via lithography and etching. In another embodiment of the present invention, the at least one nFET gate stack 18 is formed by a replacement gate process that includes the use of a dummy gate material.

Notwithstanding the technique used in forming the at least one nFET gate stack 18, the at least one nFET gate stack 18 includes, from bottom to top, gate dielectric 20, gate electrode 22, and optional gate electrode cap 24. The gate dielectric 20 includes any gate insulating material including for example, an oxide, a nitride, an oxynitride or a multilayer stack thereof. In one embodiment of the invention, the gate dielectric 20 is a semiconductor oxide, a semiconductor nitride or a semiconductor oxynitride. In another embodiment of the invention, the gate dielectric 20 includes a dielectric metal oxide having a dielectric constant that is greater than the dielectric constant of silicon oxide, e.g., 3.9. Typically, the gate dielectric 20 that is employed has a dielectric constant greater than 4.0, with a dielectric constant of greater than 8.0 being more typical. Such dielectric materials are referred to herein as a high k dielectric. Exemplary high k dielectrics include, but are not limited to $HfO_2$, $ZrO_2$, $La_2O_3$, $Al_2O_3$, $TiO_2$, $SrTiO_3$, $LaAlO_3$, $Y_2O_3$, $HfO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, a silicate thereof, and an alloy thereof. Multilayered stacks of these high k materials can also be employed as the gate dielectric 20. Each value of x is independently from 0.5 to 3 and each value of y is independently from 0 to 2.

The thickness of the gate dielectric 20 may vary depending on the technique used to form the same. Typically, the gate dielectric 20 has a thickness from 1 nm to 10 nm, with a thickness from 2 nm to 5 nm being more typical. When a high k gate dielectric is employed as the gate dielectric 20, the high k gate dielectric can have an effective oxide thickness on the order of, or less than, 1 nm.

The gate dielectric 20 can be formed by methods well known in the art. In one embodiment of the invention, the gate dielectric 20 can be formed by a deposition process such as, for example, chemical vapor deposition (CVD), physical vapor deposition (PVD), molecular beam deposition (MBD), pulsed laser deposition (PLD), liquid source misted chemical deposition (LSMCD), and atomic layer deposition (ALD). Alternatively, the gate dielectric 20 can be formed by a thermal process such as, for example, thermal oxidation and/or thermal nitridation.

The gate electrode 22 of the at least one nFET gate stack 18 comprises any conductive material including, but not limited to polycrystalline silicon, polycrystalline silicon germanium, an elemental metal, (e.g., tungsten, titanium, tantalum, aluminum, nickel, ruthenium, palladium and platinum), an alloy of at least one elemental metal, an elemental metal nitride (e.g., tungsten nitride, aluminum nitride, and titanium nitride), an elemental metal silicide (e.g., tungsten silicide, nickel silicide, and titanium silicide) and multilayer thereof. In one embodiment, the gate electrode is comprised of nFET metal gate. In one embodiment, the gate electrode is comprised of polycrystalline silicon.

The gate electrode 22 can be formed utilizing a conventional deposition process including, for example, chemical vapor deposition (CVD), plasma enhanced chemical vapor deposition (PECVD), evaporation, physical vapor deposition (PVD), sputtering, chemical solution deposition, atomic layer deposition (ALD) and other like deposition processes. When Si-containing materials are used as the gate electrode 22, the Si-containing materials can be doped within an appropriate impurity by utilizing either an in-situ doping deposition process or by utilizing deposition, followed by a step such as ion implantation or gas phase doping in which the appropriate impurity is introduced into the Si-containing material. When a metal silicide is formed, a conventional silicidation process is employed.

The as deposited gate electrode 22 typically has a thickness from 10 nm to 100 nm, with a thickness from 20 nm to 50 nm being even more typical.

In some embodiments of the invention, an optional gate electrode cap 24 can be formed atop the gate electrode 22. The optional gate electrode cap 24 includes a dielectric oxide, nitride, oxynitride or any combination thereof including multilayered stacks. In one embodiment, the optional dielectric electrode cap 24 is comprised of silicon nitride. When the optional gate electrode cap 24 is present, the optional gate electrode cap 24 is formed utilizing a conventional deposition process well known to those skilled in the art including, for example, CVD and PECVD. Alternatively, the optional gate electrode cap 24 can be formed by a thermal process such as, for example, oxidation and/or nitridation. The thickness of the optional gate electrode cap 24 may vary depending on the exact cap material employed as well as the process that is used in forming the same. Typically, the optional gate electrode cap 24 has a thickness from 5 nm to 200 nm, with a thickness from 10 nm to 50 nm being more typical. The optional gate electrode cap 24 is typically employed when the gate electrode 22 is a Si-containing material such as polysilicon.

The initial structure 10 shown in FIG. 1 also includes at least one spacer 26 whose base is located on an upper surface of the substrate 12. An edge of the at least one spacer 26 is located on a sidewall of the nFET gate stack 18. The at least one spacer 26 includes any dielectric material such as, for example, an oxide, a nitride, an oxynitride or any combination thereof. Typically, but not necessarily always, the at least one spacer 26 is comprised of a different material than the optional gate electrode cap 24. In one embodiment, the at least one spacer 26 is comprised of silicon oxide or silicon nitride. In another embodiment, the at least one spacer 26 includes a thin inner spacer, and a wider (relative to the inner spacer) outer spacer. In such an embodiment, the thin inner spacer can be comprised of silicon oxide, while the wider outer spacer can be comprised of silicon nitride.

The at least one spacer 26 can be formed utilizing processes that are well known to those skilled in the art. For example, the at least one spacer 26 can be formed by deposition of the spacer material, followed by etching. The width of the at least one spacer 26, as measured at its base, is typically from 2 nm to 50 nm, with a width, as measured at its base, from 5 nm to 15 nm being more typical.

It is observed that although FIG. 1 as well as the remaining drawings show the presence of a single nFET device region 14 and a single nFET gate stack 18, the present invention can also be practiced when more than one device region and/or more than one gate stack is present. When more than one gate stack is present, the different gate stacks can have the same or different gate dielectrics and/or gate electrode materials. Different gate dielectric and gate electrode materials can be obtained utilizing block masks to block formation of one type of material from one region, while forming the material in another region not including the block mask. When more than one gate stack is provided, the gate stacks can be used in forming a FET of the same (e.g., nFET)/or different (e.g., pFET) conductivity type.

The initial structure 10 shown in FIG. 1 further includes nFET extension regions 28. In FIG. 1, one of the regions labeled as 28 is a source nFET extension region, while the other region labeled as 28 is the drain nFET extension region. The nFET extension regions 28 can be formed into the semiconductor substrate 12 utilizing an extension ion implantation process that is well known to those skilled in the art. The at least one nFET gate stack 18 and, if present, the at least one spacer 26, serve as an implantation mask during the extension ion implant process. After implanting the extension regions 28, an anneal can be used to activate the extension regions 28. The anneal, which can be performed any time after the ion implantation step, is typically performed at a temperature greater than 800° C., with a temperature of greater than 850° C. being more typical. The anneal can be performed utilizing any conventional anneal process. Examples of anneals that can be employed include, for example, a rapid thermal anneal, a furnace anneal, a laser anneal, a microwave anneal, or a combination of those techniques. The duration of the anneal, i.e., the annealing time, may vary depending on the exact anneal process utilized as well as the temperature of the anneal. Typically, the anneal is performed for a time period of 10 minutes or less. The anneal is typically performed in an inert ambient such as, for example, helium, nitrogen, and/or argon. In some embodiments, the annealing can be performed utilizing a forming gas (a mix of hydrogen and nitrogen).

It is observed that the portion of the semiconductor substrate 12 that is located beneath the at least one nFET gate stack 18 which is bounded by the extension regions 38 is the device channel 40.

In some embodiments of the present invention, an optional halo implant is performed that forms optional halo regions (not shown) within the semiconductor substrate 12 of the initial structure 10. The optional halo implant can be performed utilizing any conventional halo implant, such as an angled halo ion implant, that is well known to those skilled in the art. After the optional halo implant, an optional halo activation anneal is typically performed at a temperature of 1350° C. or less. In one embodiment, the optional halo activation anneal can include a laser anneal or rapid thermal anneal.

Figure 2:
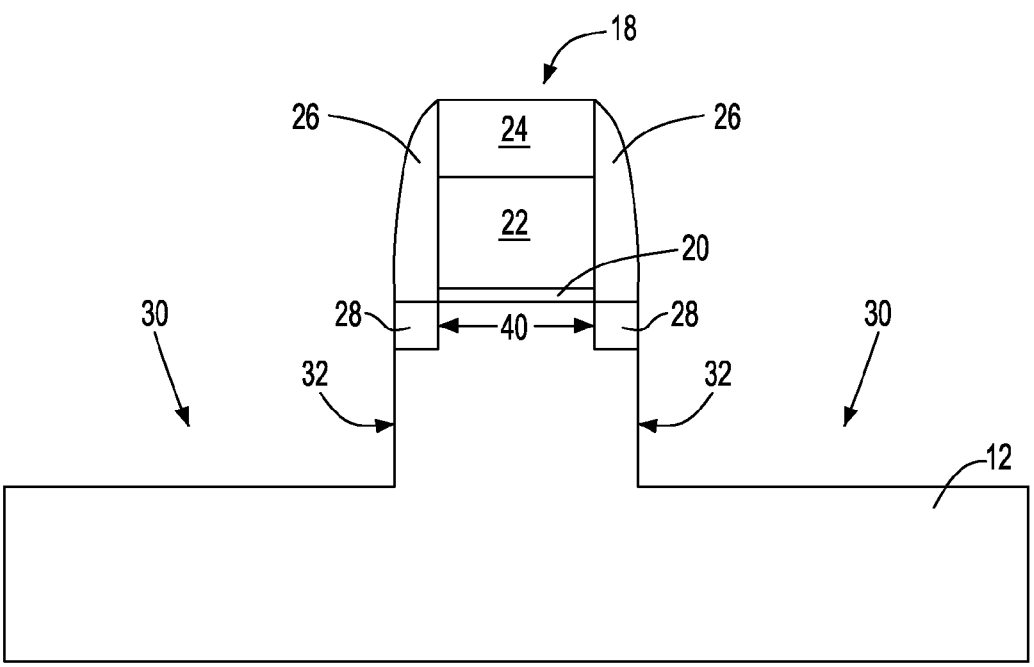
FIG. 2 is a pictorial representation (through a cross sectional views) illustrating the initial structure of FIG. 1 after forming recessed regions with the semiconductor substrate at the footprint of the at least one nFET gate stack.

Referring to FIG. 2, there is shown the structure of FIG. 1 after forming a pair of recessed regions 30 within the semiconductor substrate 12 at the footprint of the at least one nFET gate stack 18. It is observed that the pair of recessed regions 30 is formed within the substrate 12 on opposite sides of a particular gate stack. The pair of recessed regions 30, e.g., source/drain trenches, is formed utilizing an etching technique that is well known to those skilled in the art. The at least one nFET gate stack 18 and, if present, the at least one spacer 26 serve as an etch mask during the etching process. The depth of the recessed regions 30, as measured from the top surface of the substrate 12 to the bottom of the recessed regions 30, is typically from 20 nm to 150 nm, with from 30 nm to 70 nm being more typical.

The etching that can be used in forming the pair of recessed regions 30 includes wet etching, dry etching or a combination of wet and dry etching. In one embodiment, an anisotropic etch is employed in forming the pair of recessed regions 30. In another embodiment, an isotropic etch is employed in forming the pair of recessed regions 30. In a further embodiment, a combination of anisotropic etching and isotropic etching can be employed in forming the pair of recessed regions 30. When a dry etch is employed in forming the pair of recessed regions 30, the dry etch can include one of reactive ion etching (RIE), plasma etching, ion beam etching and laser ablation. When a wet etch is employed in forming the pair of recessed regions 30, the wet etch includes any chemical etchant, such as, for example, ammonium hydroxide that selectively etches the exposed nFET device regions 14 of the semiconductor substrate 12. In some embodiments, a crystallographic etching process can be used in forming the pair of recessed regions 30.

In the embodiment illustrated in FIG. 2, the etching provides a pair of recessed regions 30 within the semiconductor substrate 12 that have substantially straight sidewalls 32. The substantially straight sidewalls 32 may have some taper. It is observed that one of the recessed regions forms a source trench within the semiconductor substrate 12, while the other recessed region forms a drain trench within the semiconductor substrate 12.

In an alternative embodiment (not shown), a structure can be formed having a pair of faceted recessed regions. The alternative structure can be formed utilizing a dry etching process, followed by a lateral wet etching process. The lateral wet etch process can include, for example, ammonium hydroxide.

Figure 3:
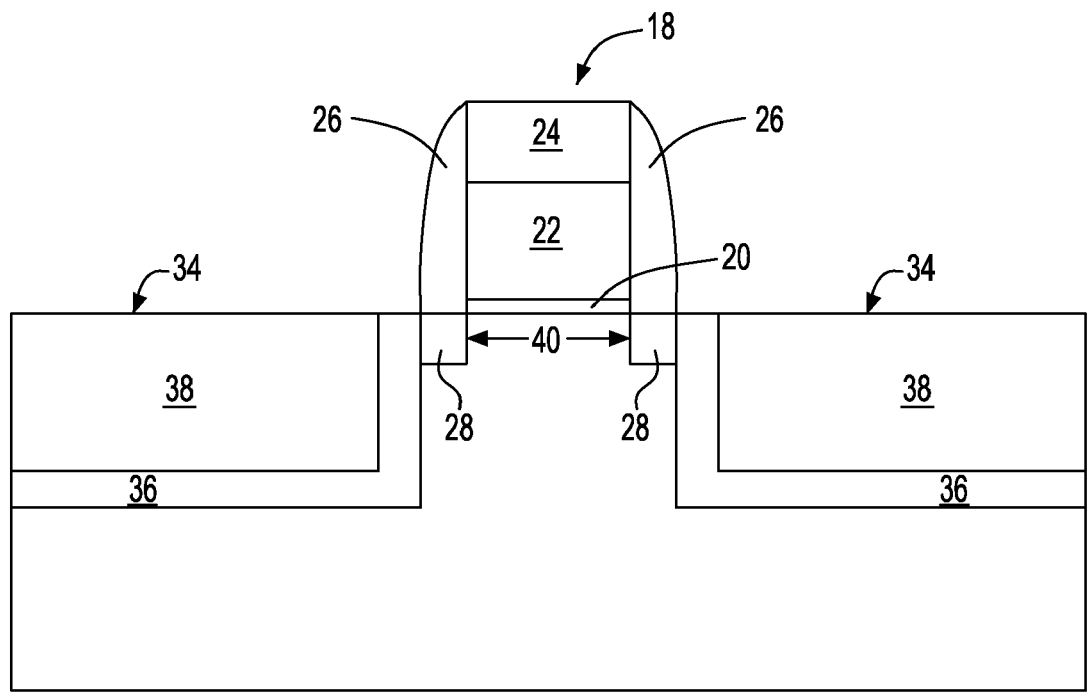
FIG. 3 is a pictorial representation (through a cross sectional view) illustrating the structure of FIG. 2 after forming a bi-layer n-FET embedded stressor element within each of the recessed regions.

Referring to FIG. 3, there is shown the structure of FIG. 2 after forming a bi-layer nFET embedded stressor element 34 within each of the recessed regions 30. The bi-layer nFET embedded stressor element 34 includes a first layer 36 of a first epitaxy semiconductor material and a second layer 38 of a second epitaxy semiconductor material. As shown, the first layer 36 is located on exposed surfaces of semiconductor substrate 12 within recessed regions 30, while the second layer 38 is located on an upper surface of the first layer 36.

The first layer 36 of the first epitaxy semiconductor material has a different lattice constant than the lattice constant of the semiconductor substrate 12 and is capable enhancing the electron mobility of the device channel 40. In one preferred embodiment of the invention and when the semiconductor substrate 12 is comprised of silicon, the first layer 36 of the first epitaxy semiconductor material is composed of silicon carbon (Si:C).

In one embodiment, the first layer 36 of the first epitaxy semiconductor material can be undoped, i.e., has a zero dopant concentration. That is, the first layer 36 can be comprised of an intrinsic semiconductor material. In another embodiment, the first layer 36 of the first epitaxy semiconductor material is doped with an n-type dopant. When doped, the first layer 36 of the first epitaxy semiconductor material can have a dopant concentration from 5E19 atoms/cm$^3$ to 1E21 atoms/cm$^3$, with a dopant concentration from 1E20 atoms/cm$^3$ to 7E20 atoms/cm$^3$ being more typical. The n-type dopant includes an atom from Group VA of the Periodic Table of Elements including, for example, phosphorus (P), arsenic (As), and antimony (Sb), with P being preferred in some embodiments of the invention.

The first layer 36 of the first epitaxy semiconductor material fills a lower portion of each of the recessed regions 30 and covers the exposed sidewalls of the semiconductor substrate 12 within each of the recessed regions 30. The thickness of the first layer 36 of the bi-layer nFET stressor element 34 is typically from 2 nm to 40 nm, with a thickness from 15 nm to 30 nm being even more typical.

The first layer 36 of the bi-layer nFET embedded stressor element 34 is formed into the pair of recessed regions 30 utilizing any epitaxial growth process that is well known to those skilled in the art. The epitaxial growth ensures that the first layer 36 of the first epitaxy semiconductor material is crystalline and has a same crystallographic structure as that of the surface of the semiconductor substrate 12 in which the first layer 36 is formed. In one embodiment, a conformal epitaxial growth process can be employed in forming the first layer 36 of the first epitaxy semiconductor material. The utilization of a conformal epitaxial process ensures that the first layer 36 of the first epitaxy semiconductor material is conformal to the exposed surfaces of the semiconductor substrate 12 that defines each recessed region. That is, a conformal epitaxial process provides a first layer 36 of first epitaxy semiconductor material within the pair of recessed regions 30 that follows the contour of each recessed region. In embodiments in which the first layer 36 is doped, the first layer 36 can be formed utilizing an in-situ doped epitaxial growth process in which the dopant atoms are incorporated into the precursor gas mixture. The types of precursors used in forming the first layer of the first epitaxy semiconductor material are well known to those skilled in the art.

The second layer 38 of the bi-layer nFET embedded stressor element 34 is then formed on the upper surface of the first layer 36. The second layer 38 of the bi-layer nFET embedded stressor element 34 includes a second epitaxy semiconductor material that has a lower resistance to dopant diffusion than the first epitaxy semiconductor material of the first layer 36. That is, the second epitaxy semiconductor material of the second layer 38 has higher solubility for n-type dopants as compared to the first epitaxy semiconductor material of the first layer 36. Typically, the second epitaxy semiconductor material of the second layer 38 has a lattice constant that is the same as that of the semiconductor substrate 12. In a preferred embodiment of the invention, and when the semiconductor substrate 12 is comprised of silicon, the second layer of the bi-layer nFET stressor element 34 is comprised of silicon.

In one embodiment, the second layer 38 of the bi-layer nFET embedded stressor element 34 can be undoped, i.e., has a zero dopant concentration. That is, the second layer 38 of the bi-layer nFET embedded stressor element 34 can be comprised of an intrinsic semiconductor material. In another embodiment, the second layer 38 of the bi-layer nFET embedded stressor element 34 is doped with an n-type dopant. When doped, the second layer 38 of the bi-layer nFET embedded stressor element 34 can have a dopant concentration from 5E21 atoms/cm$^3$ to 1E21 atoms/cm$^3$, with a dopant concentration from 8E19 atoms/cm$^3$ to 4E20 atoms/cm$^3$ being more typical. The n-type dopant includes the same or different, preferably the same n-type dopant present within the first layer 36 of the bi-layer nFET embedded stressor element 34.

The second layer 38 can partially or completely fill the remaining portions of each of the recessed regions. In one embodiment, the second layer 38 is substantially co-planar with an upper surface of the semiconductor substrate 12. In another embodiment, the second layer 38 has a top surface that is located below the upper surface of the semiconductor substrate 12. In yet another embodiment, the second layer 38 can extend atop the upper surface of the semiconductor substrate 12.

The second layer 38 of the bi-layer nFET embedded stressor element 34 can be formed by a conventional epitaxial growth process including the conformal epitaxy process mentioned above with respect to the first epitaxy semiconductor material of the first layer 36. Any known precursor can be used in forming the second layer 38. In some embodiments of the invention, the first and second layers of the bi-layer nFET embedded stressor 34 element can be formed without breaking vacuum between the formation of these layers. In other embodiments, the first and second layers of the bi-layer nFET embedded stressor element 34 are formed by breaking vacuum between each epitaxial growth step.

Figure 4:
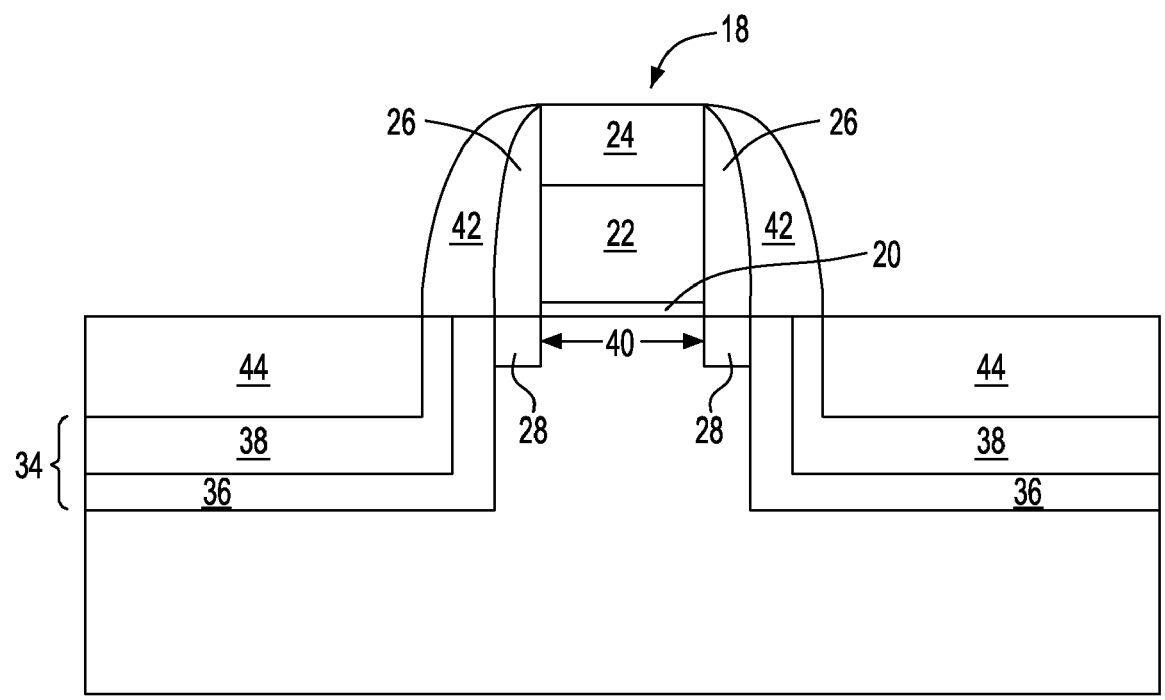
FIG. 4 is a pictorial representation (through a cross sectional view) illustrating the structure of FIG. 3 after further CMOS processing including spacer formation and formation of a source region and a drain region, collectively referred to herein as source/drain regions.

Referring now to FIG. 4 there is shown the structure of FIG. 3 after further CMOS processing including formation of another spacer 42 (which can be referred to herein as an outer spacer relative to spacer 26) and formation of a source region and drain region (collectively referred to herein as source/drain regions 44). In some embodiments of the invention and prior to the formation of the another spacer 42, the optional gate electrode cap 24 can be removed from the structure. The removal of the optional gate electrode cap 24 can be performed utilizing an etchant that selectively removes the gate electrode cap material relative to the at least one spacer 26, the underlying gate electrode 22 and the second layer 38 of the bi-layer nFET embedded stressor element 34. An example of such an etchant includes, but is not limited to reactive ion etching.

Spacer 42 is formed utilizing the same or different process as used in forming the at least one spacer 26. Spacer 42 can be comprised of the same or different dielectric material as the at least one spacer 26. In one embodiment, spacer 42 is composed of a different dielectric material as compared to the at least one spacer 26. In one embodiment, spacer 42 is a spacer defining silicide proximity. Spacer 42 can be formed by a conventional silicide process and etching.

In some embodiments, and prior to the formation of spacer 42, the at least one spacer 26 can be removed and spacer 42 is formed in direct contact with sidewalls of nFET gate stack 18. Spacer 42 has a base that is located atop a portion of the first layer 36 of the bi-layer nFET embedded stressor element 34 and a portion that extends onto a portion of the second layer 38 of the bi-layer nFET embedded stressor element 34. In the illustrated embodiment, a lateral edge of spacer 42 is in direct contact with a sidewall of the at least one spacer 26.

After formation of spacer 42, source/drain regions 44 are formed into an upper exposed surface of the second layer 38 of the bi-layer nFET embedded stressor element 34. The source/drain regions 44 are formed utilizing a source/drain ion implantation process followed by annealing. Spacer 42 serves as an ion implantation mask. The source/drain ion implantation is performed utilizing conditions such that no portion of the implant occurs into the first layer 36 of the bi-layer nFET stressor element 34. As such, the first layer 36 of the bi-layer nFET embedded stressor element 34 is not damaged by this ion implantation. Since the first layer 36 of the bi-layer nFET embedded stressor element 34 is not damaged, the strain imparted to the device channel 40 by the first layer 36 is maintained. That is, no relaxation of the first layer 36 of the bi-layer nFET embedded stressor element 34 occurs during the formation of the source/drain regions 44. This leads to a lower resistance device in which the drive current thereof is improved. Also, since the first layer 36 of the bi-layer nFET embedded stressor element is not damaged, i.e., it is defect free, the dopants within the first layer 36 of the bi-layer nFET embedded stressor element 34 are impeded. Typically, the source/drain ion implantation is performed utilizing As, 5-40 KeV energy with 1E15 to 5E15 dosage.

Figure 5:
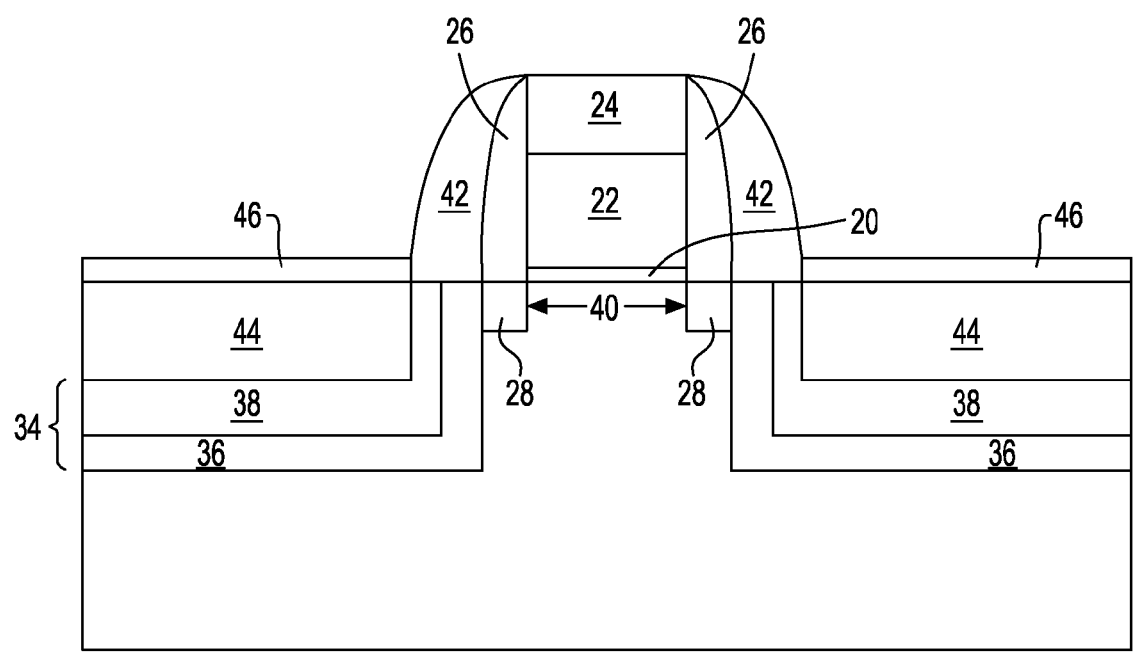
FIG. 5 is a pictorial representation (through a cross sectional view) illustrating the structure of FIG. 4 after formation of a metal semiconductor alloy, e.g., silicide, contact atop the source/drain region.

Referring now to FIG. 5, there is shown the structure of FIG. 4 after further CMOS processing including formation of metal semiconductor alloy contacts 46. The metal semiconductor alloy contacts 46 are formed utilizing any process that is capable of forming a metal semiconductor alloy atop a semiconductor material. In one embodiment of the invention, the metal semiconductor alloy contacts 46 are formed utilizing a silicide process. The silicide process can be self-aligned to the outer edge of the another spacer 42. The silicide process includes forming a metal capable of forming a metal semiconductor alloy when reacted with a semiconductor material atop at least the second layer 38 of the bi-layer nFET embedded stressor element 34. The metal used in forming the metal semiconductor alloy contact regions 46 can include, but are not limited to, tantalum, titanium, tungsten, ruthenium, cobalt, nickel, or any suitable combination of those materials. A diffusion barrier such as titanium nitride or tantalum nitride can be formed atop the metal. An anneal is performed that causes reaction between the metal and the underlying semiconductor material forming metal semiconductor alloy regions. Typically, the anneal is performed at a temperature of at least 250° C. or above. A single anneal step or multiple anneal steps can be used. Any non-reacted metal and the optional diffusion barrier are removed after the anneal has been performed. In some embodiments, a metal semiconductor alloy contact can be formed directly atop the gate electrode 22, when the optional gate electrode cap 24 is removed and the gate electrode 22 is composed of a Si-containing material.

While the present invention has been particularly shown and described with respect to preferred embodiments thereof, it will be understood by those skilled in the art that the foregoing and other changes in forms and details may be made without departing from the spirit and scope of the present invention. It is therefore intended that the present invention not be limited to the exact forms and details described and illustrated, but fall within the scope of the appended claims.

What is claimed is:

1. A semiconductor structure comprising:
    at least one nFET gate stack located on an upper surface of a semiconductor substrate;
    a bi-layer nFET embedded stressor element located at a footprint of the at least one nFET gate stack substantially within a pair of recessed regions which are present on opposite sides of said at least one nFET gate stack, said bi-layer nFET embedded stressor element including a first layer of a first epitaxy semiconductor material having a lattice constant that is different from a lattice constant of the semiconductor substrate and imparts a tensile strain in a device channel that is located beneath the at least one nFET gate stack, and a second layer of a second epitaxy semiconductor material that has a lower resistance than the first epitaxy semiconductor material, wherein said first layer of said bi-layer nFET embedded stressor element fills a lower portion of each recessed region and entirely covers all wall portions of the semiconductor substrate;
    a spacer adjoining said nFET gate stack, wherein said spacer has a base that covers an upper surface of the first layer of the bi-layer nFET stressor element and extends onto an upper surface of said second layer of the bi-layer nFET stressor element; and
    a source/drain region located within said second layer of said bi-layer nFET embedded stressor element, but not said first layer of said bi-layer nFET embedded stressor element.

2. The semiconductor structure of claim 1 wherein said semiconductor substrate is bulk Si or a silicon-on-insulator.

3. The semiconductor structure of claim 1 wherein said pair of recessed regions have substantially straight sidewalls.

4. The semiconductor structure of claim 1 further comprising a metal semiconductor alloy contact located at least on a top surface of said second layer of the bi-layer nFET embedded stressor element.

5. The semiconductor structure of claim 1 further comprising at least one inner spacer having a base located on a surface of said semiconductor substrate and having one lateral edge in contact with a sidewall of said at least one nFET gate stack and another lateral edge in contact a lateral edge of said spacer.

6. The semiconductor structure of claim 1 wherein said spacer is a silicide spacer.

7. The semiconductor structure of claim 1 wherein said second layer of said bi-layer nFET stressor element has a top surface that is coplanar with, or extends above, said upper surface of said semiconductor substrate.

8. The semiconductor structure of claim 1 wherein said first layer of the bi-layer nFET embedded stressor element includes no implanted defects or damages.

9. The semiconductor structure of claim 2 wherein said first layer of said bi-layer nFET embedded stressor element is composed of Si:C, and said second layer of said bi-layer nFET embedded stressor element is composed of silicon.

10. The semiconductor structure of claim 9 wherein said first layer of Si:C and said second layer of silicon are both doped with an n-type dopant.

11. The semiconductor structure of claim 9 wherein said first layer of Si:C and said second layer of silicon are both intrinsic semiconductor materials.

12. A semiconductor structure comprising:
    at least one nFET gate stack located on an upper surface of a semiconductor substrate;
    a bi-layer nFET embedded stressor element located at a footprint of the at least one nFET gate stack substantially within a pair of recessed regions which are present on opposite sides of said at least one nFET gate stack, said bi-layer nFET embedded stressor element including a first layer comprised of Si:C and a second layer comprised of silicon, wherein said first layer of said bi-layer nFET embedded stressor element fills a lower portion of each recessed region and entirely covers all wall portions of the semiconductor substrate;
    a spacer adjoining said nFET gate stack, wherein said spacer has a base that covers an upper surface of the first layer of the hi-layer nFET stressor element and extends onto an upper surface of said second layer of the bi-layer nFET stressor element; and
    a source/drain region within said second layer of said bi-layer nFET embedded stressor element, but not said first layer of said bi-layer nFET embedded stressor element.

13. The semiconductor structure of claim 12 wherein said first layer of Si:C and said second layer of silicon are both doped with an n-type dopant.

14. The semiconductor structure of claim 12 wherein said first layer of Si:C and said second layer of silicon are both intrinsic semiconductor materials.

15. A method of fabricating a semiconductor structure comprising:
    forming a pair of recessed regions within a semiconductor substrate at a footprint of a nFET gate stack;
    forming a first layer of a first epitaxy semiconductor material in each of said recessed regions, said first layer has a lower surface that is in contact with exposed surfaces of the semiconductor substrate within said recessed regions and said first epitaxy semiconductor material having a lattice constant that is different from a lattice constant of the semiconductor substrate and imparts a tensile strain in a device channel that is located beneath the at least one nFET gate stack;

forming a second layer of a second epitaxy semiconductor material atop the first layer, wherein said second epitaxy semiconductor material has a lower resistance to dopant diffusion than the first epitaxy semiconductor material and said first and second layers form a bi-layer nFET embedded stressor element;

forming a spacer adjoining said nFET gate stack, wherein said spacer has a base that covers an upper surface of the first layer of the bi-layer nFET stressor element and extends onto an upper surface of said second layer of the bi-layer nFET stressor element; and forming a source/drain region within said second layer of said bi-layer nFET embedded stressor element using said spacer as an ion implantation mask, but not said first layer of said bi-layer nFET stressor element.

16. The method of claim 15 wherein said forming said pair of recessed regions includes wet etching, dry etching, or a combination thereof.

17. The method of claim 15 wherein said forming said pair of recessed regions includes dry etching, followed by a lateral wet etch process.

18. The method of claim 15 wherein said first layer and said second layer of said bi-layer nFET embedded stressor element are both formed by an epitaxial growth process.

19. The method of claim 15 wherein said first layer and said second layer of said bi-layer nFET embedded stressor element are formed without breaking a vacuum between formation of each layer.

20. The method of claim 15 further comprising forming a halo implant region within said substrate, said halo implant region is formed prior to forming the bi-layer nFET embedded stressor element.

21. The method of claim 15 further comprising forming a metal semiconductor alloy contact atop the source/drain region.

22. The method of claim 15 wherein spacer is an outer spacer that is in contact at one lateral edge with an inner spacer.

23. The method of claim 18 wherein said epitaxial growth process includes an in-situ doped epitaxial growth process.

24. The method of claim 22 wherein said outer spacer is a silicide spacer.

* * * * *